(12) United States Patent
Guja et al.

(10) Patent No.: US 7,708,565 B2
(45) Date of Patent: May 4, 2010

(54) CONNECTION ARRANGEMENT AND METHOD FOR OPTICAL COMMUNICATIONS

(75) Inventors: Victor Bogdan Guja, San Glusto Canavese (IT); Mauro Cerisola, San Mauro Torinese (IT); Domenico Campi, Turin (IT)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 11/715,196

(22) Filed: Mar. 7, 2007

(65) Prior Publication Data
US 2007/0218712 A1 Sep. 20, 2007

(30) Foreign Application Priority Data
Mar. 15, 2006 (GB) .................. 0605221.1

(51) Int. Cl.
*H01R 12/00* (2006.01)
(52) U.S. Cl. .................. 439/67; 439/327; 439/928.1
(58) Field of Classification Search .................. 439/67, 439/86, 91, 327, 928.1
See application file for complete search history.

(56) References Cited

U.S. PATENT DOCUMENTS

| | | | |
|---|---|---|---|
| 3,971,610 A * | 7/1976 | Buchoff et al. ................. | 439/75 |
| 5,364,277 A * | 11/1994 | Crumly et al. ................. | 439/67 |
| 5,365,268 A | 11/1994 | Minami | |
| 5,477,612 A * | 12/1995 | Roberts ......................... | 29/846 |
| 5,738,530 A * | 4/1998 | Schreiber et al. .............. | 439/66 |
| 5,977,489 A * | 11/1999 | Crotzer et al. ............... | 174/257 |
| 6,417,885 B1 * | 7/2002 | Suzuki et al. ................ | 348/374 |
| 2005/0014394 A1 * | 1/2005 | Hedler et al. ................. | 439/55 |
| 2007/0218712 A1 * | 9/2007 | Guja et al. ..................... | 439/67 |

FOREIGN PATENT DOCUMENTS

| | | |
|---|---|---|
| EP | 1 499 167 A2 | 1/2005 |
| JP | 2002063958 | 2/2002 |

OTHER PUBLICATIONS

Search report from corresponding application No. GB0605221.1 dated Jun. 29, 2006.

* cited by examiner

*Primary Examiner*—James Harvey

(57) ABSTRACT

An arrangement for connecting an electronic subassembly and an optical subassembly in an electro-optical communication device such as an electro-optical transceiver. The arrangement includes a body of a rigid dielectric material for mounting e.g. on the optical subassembly. The body has electrically conductive pathways provided thereon and includes a shaped portion providing a socket-like formation. At least one electrical contact element is coupled with e.g. the electronic subassembly. The electrical contact element is pluggable into the socket-like formation of the body of rigid dielectric material and includes an elastic device adapted to elastically co-operate with the socket-like formation of the body of rigid dielectric material to retain the electrical contact element plugged in the socket-like formation to provide electrical contact with the electrically conductive pathways provide thereon, while permitting vibrational displacement of the electrical contact element within the socket-like formation.

11 Claims, 2 Drawing Sheets

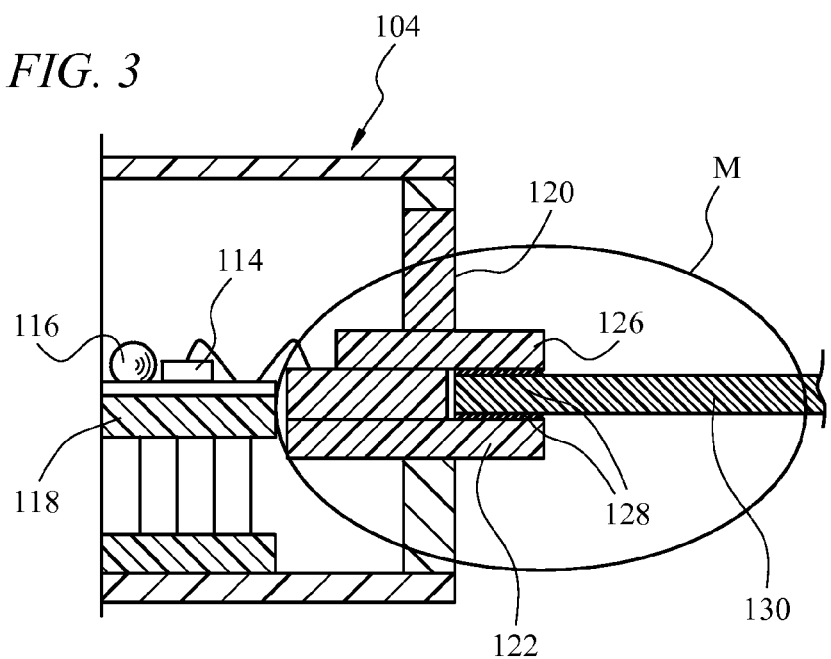
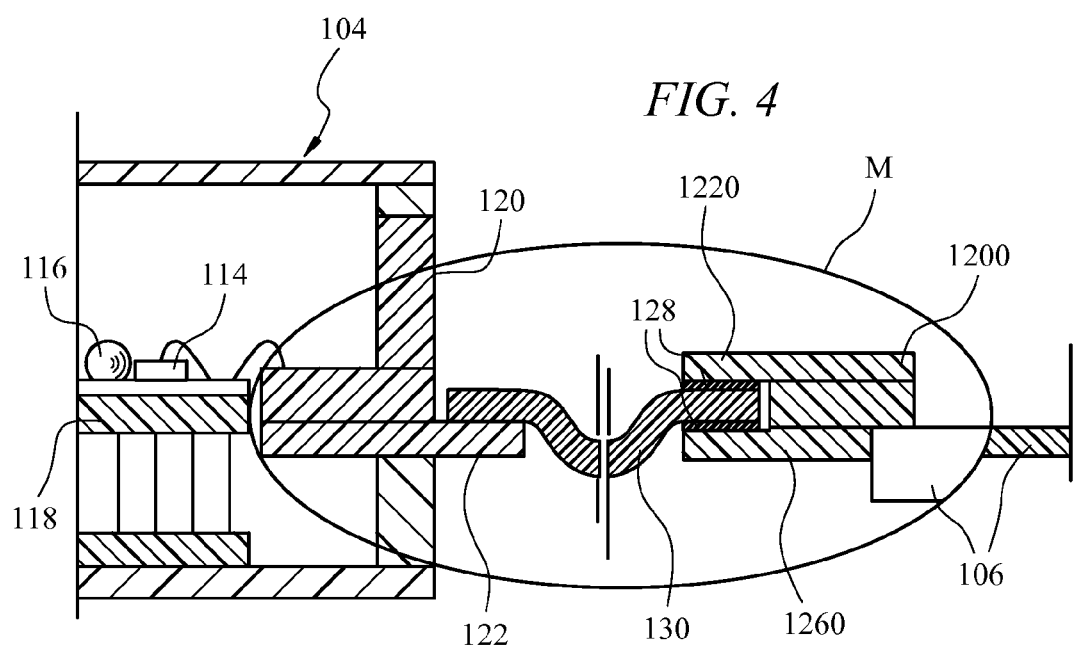

CONNECTION ARRANGEMENT AND METHOD FOR OPTICAL COMMUNICATIONS

BACKGROUND

1. Field of the Disclosure

The present disclosure relates to connection arrangements for optical communications.

The disclosure was developed with specific attention paid to the possible use in connecting Optical Sub Assemblies (OSA's) and Electronic Sub Assemblies (ESA's) in optical communication devices such as e.g. transceivers for optical communications.

2. Discussion of the Background Art

Electro-optical communication devices such as transceivers for optical communications typically comprise an Electronic Sub Assembly (ESA) and an Optical Sub Assembly (OSA) in a single package. Such an arrangement is schematically illustrated in FIG. 1, where a carrier body 100, typically of a metal material, is shown having mounted thereon an Electronic Sub Assembly (ESA) 102 and an Optical Sub Assembly (OSA) 104. The Electronic Sub Assembly 102 is e.g. in the form of a small printed circuit board (PCB) 106 having electronic circuitry 108 mounted thereon. The Optical Sub Assembly 104 is typically in the form of a casing or enclosure mounted at the "distal" end 110 of the carrier body or package 100 of the transceiver where the optical components of the transceiver i.e. the laser diode (transmitter) and the photodetector (receiver) are arranged in view of connection to the optical link fibre(s).

A current trend in recent years is to make transceivers pluggable, possibly in the form of "hot" pluggable units, that is units that can be plugged/unplugged in a host system without powering-off the host system. Such an arrangement is exemplified in FIG. 1. There, the ESA illustrated is provided at its "proximal" end with slidable electrical contacts 112 that enable plugging/unplugging the transceiver in a sort of socket (not shown) provided in the rack where the transceiver is mounted.

Proper and effective connection between the OSA and the ESA is a critical issue in manufacturing optical transceivers, especially when operating rates of the order of 10 Gbit/s and higher are contemplated.

In the first place, the connection must be as short as possible in order to guarantee high data rates. Additionally, the connection should be not too rigid in order to avoid damages due to shocks or vibrations.

Assembling the OSA and the ESA in the transceiver package should be a simple, reliable process. The ESA and the OSA are tested separately (in order to circumvent yield problems related to malfunctioning of only one of the subassemblies) and then connected. After being assembled and connected, the ESA and the OSA are tested again in order to extract and verify the programming parameters and the functionality of the complete transceiver.

Assembling the OSA and the ESA is usually performed manually or by resorting to automated, dedicated soldering process that inevitably tend to be quite expensive.

FIG. 2 is an enlarged view of the portion of FIG. 1 indicated by arrow II and includes a portion M magnified for the sake of clarity of illustration. FIG. 2 is exemplary of conventional solutions where the connection of the OSA and the ESA is produced by (hand) soldering brazed leads of the OSA directly onto soldering pads carried by the ESA.

Specifically, the left-hand portion of FIG. 2 illustrates some of the components typically located within the OSA casing. By referring, by way of example, to the transmitter side, these include a laser diode 114 having associated focusing optics in the form of e.g. a "ball" lens 116. The laser source 114 is mounted onto a thermal conditioning element 118 such as a Peltier element.

While the transmitter side of the OSA is considered here by way of example, a substantially similar layout can be considered for the receiver side—insofar as the points of momentum for the disclosure are concerned. Additionally, while a transceiver is being primarily referred to, this description will almost identically apply to electro-optical communication devices including only a transmitter or a receiver.

As used herein, the wording "electro-optical communication device" is thus inclusive of any of an optical transmitter, an optical receiver and an optical transmitter/receiver (i.e. a "transceiver").

The reference numeral 120 designates as a whole a "feedthrough", namely a shaped body of a rigid material as required for high data rate operation—such as e.g. ceramics or glass that creates (via electrical conductive stripes provided thereon) electrical pathways through the OSA casing. Specifically, in the exemplary arrangement illustrated in FIG. 2, the feedthrough 120 is shown having a sort of pod-like formation 122 protruding from the OSA casing wall. One or more electrical leads 124 brazed on the upper side of the formation 122 extend from the OSA feedthrough 120 to be soldered to corresponding conductive pads (not visible) on the ESA thus ensuring electrical connection between the OSA and the ESA. Alternative prior art solutions may include, in the place of the lead or leads 124, a flexible printed circuit board, known also as a "flex".

However effective, the prior art solutions discussed in the foregoing are costly and entail a number of disadvantages. In appreciating these negative factors, one must take into account the fact that the elements involved are generally very small: for instance, the ceramics/glass body comprising the feedthrough 120 may have a height and a length (as observed in FIG. 2) smaller than 5 mm, typically 3 mm or less.

On that size scale, leads such as the leads 124 may turn out to be too rigid, and measures have to be taken in order to improve resistance against shocks and vibrations. This requires design efforts, expensive profiling fixtures and making the leads longer than strictly required for connection purposes. However, longer leads included in the RF portion of the transceiver militate against high data throughput.

Using a "flex" (i.e. a flexible printed circuit board) somehow palliates the problems related to shock resistance. Unfortunately, using a flex renders the assembly process rather complicated, this being particularly the case if an automated production environment is considered. Additionally, in those optical communication devices where a very limited space is available, such as e.g. Small Form Factor Pluggable (SFP) transceivers, using a short flex is practically mandatory, and such a short flex tends to be as rigid as a fixed lead.

A particularly penalising feature of prior art arrangements as illustrated in FIG. 2 lies in that these arrangements involve a steady (i.e. non-releasable) connection between the OSA and the ESA e.g. by soldering. In the case of malfunctioning of either subassembly, the transceiver as a whole is usually disposed of: in fact, separating the malfunctioning subassembly from the subassembly that operates correctly, removing the malfunctioning subassembly from the transceiver, substituting a replacement unit for the malfunctioning subassembly removed and re-establishing the mechanical and electrical connections between the OSA and the ESA is an expensive and time-consuming process, and may also give rise to problems in terms of reliability. In turn, the OSA and ESA are both rather expensive components, and dispensing with transceiver—as a whole—because only one of the ESA and the OSA is malfunctioning is hardly an acceptable choice from the economical viewpoint.

The object of the present disclosure is thus to provide an arrangement that overcomes the drawbacks intrinsic to the prior arrangements considered in the foregoing.

SUMMARY OF THE DISCLOSURE

According to the present disclosure, that object is achieved by means of an arrangement having the features set forth in the claims. The disclosure also relates to a corresponding method. The claims are an integral part of the disclosure of the disclosure provided herein.

A particularly preferred embodiment of the disclosure is an arrangement for connecting an electronic subassembly and an optical subassembly in an electro-optical communication device (i.e. an electro-optical transmitter, an electro-optical receiver, or an electro-optical transceiver). Such an arrangement includes a body of a rigid dielectric material for mounting on either of the electronic subassembly and the optical subassembly. The body has electrically conductive pathways provided thereon and includes a shaped portion providing a socket-like formation. At least one electrical contact element is coupled with the other of the electronic subassembly and the optical subassembly. The contact element is pluggable into the socket-like formation of the body of rigid dielectric material and includes elastic means adapted to elastically co-operate with the socket-like formation of the body of a rigid dielectric material to retain the contact element plugged in the socket-like formation to provide electrical contact with the electrically conductive pathways provide thereon, while permitting vibrational displacement of the contact element within the socket-like formation.

In brief, the arrangement described herein makes an ESA pluggable into the OSA of an electro-optical communication device such as a transceiver or vice-versa. This solution offers a significantly shorter RF path compared to fixed leads or a conventional flex arrangement. This avoids also the problems of rigid connections of the OSA and ESA, improving shock and vibration resistance. Additionally, the capability for quick and simple connection and/or reconnection improves the testing environment of the OSA and ESA. In the case of malfunctioning, only the malfunctioning portion is removed and replaced.

BRIEF DESCRIPTION OF THE DRAWINGS

The disclosure will now be described, by way of example only, with reference to the enclosed figures of drawing, wherein:

FIG. 3 represents, by way of direct comparison to the representation of FIG. 2, a first possible embodiment of the arrangement described herein, and.

FIG. 4 represents, again by way of direct comparison to the representation of FIG. 2, a second possible embodiment of the arrangement described herein.

DETAILED DESCRIPTION OF THE PREFERRED EMBODIMENT

Figure 1:
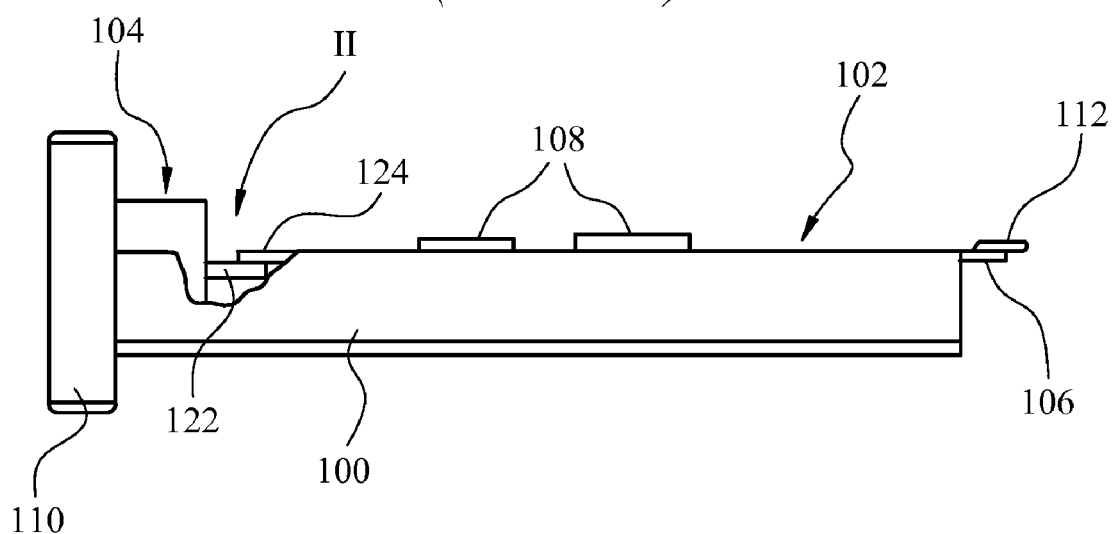
FIG. 1 is a perspective view of a prior art transceiver for optical communication.

In FIGS. 3 and 4, reference signs/numerals identical to those already appearing in FIG. 1 and FIG. 2 were used to designate parts/elements that are identical or equivalent to those already described in connection with FIGS. 1 and 2.

Consequently, FIGS. 3 and 4 again show a feedthrough 120 comprised of e.g. a ceramics material such as alumina as required for high data rate operation (10 Gbit/s or higher).

The feedthrough 120 of FIG. 4 (to be described later) is essentially identical to the feedthrough 120 of FIG. 2.

Figure 2:
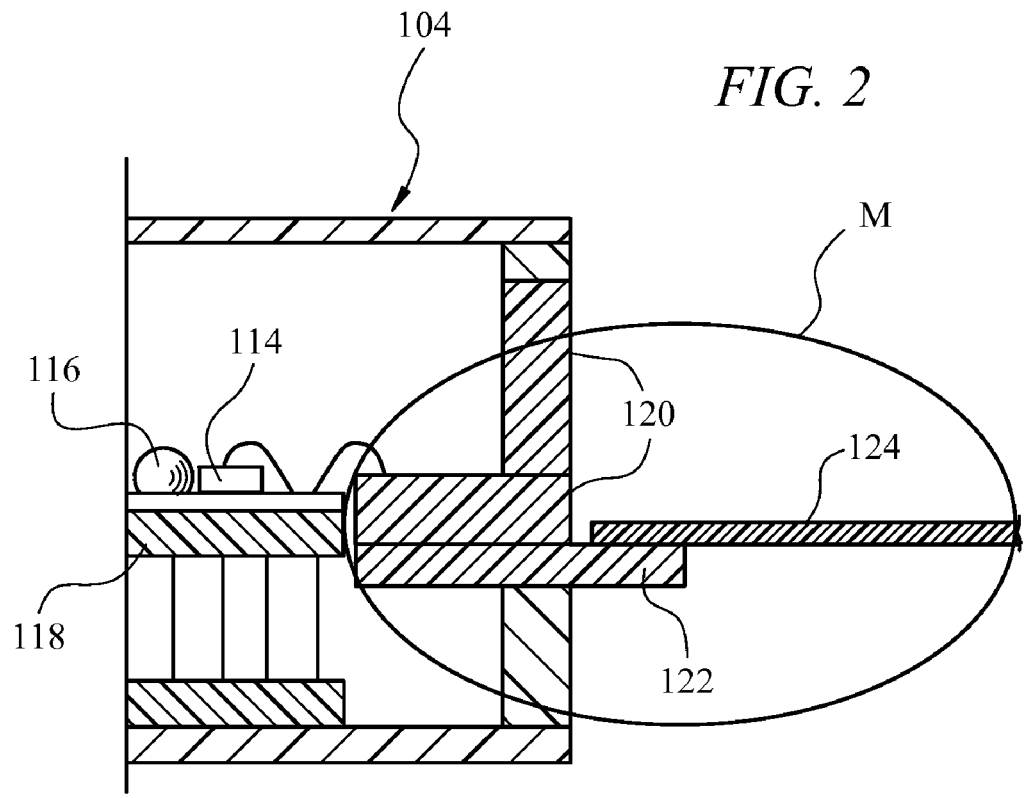
FIG. 2 is an enlarged view of the portion of FIG. 1 indicated by arrow II.

Conversely, the layout of the feedthrough 120 of FIG. 3 uses the feedthrough 120 of FIG. 2 as a basis to include therein a further pod-like extension 126 that jointly defines with the pod-like formation portion 122 a clamp or socket. A "flex" circuit 130 as described in the foregoing can thus be plugged into that clamp or socket and reliably retained therein to ensure electrical connection between the ESA and the OSA, while making possible for it to be easily unplugged from the clamp/socket 122, 126 whenever desired/required.

The flex circuit 130 is provided with one or more electrical contact elements comprised of metallisation patterns, such as e.g. gold bumps, that either constitute by themselves or have associated resilient (i.e. elastic) spring like elements 128. Such elastic elements are adapted to co-operate with the formations 122, 126 of the very rigid feedthrough 120 comprised of a ceramic or glass body such as an alumina body. The elastic elements 128 are adapted to provide a tight but elastic contact that is mechanically and electrically stable.

Specifically, the elements 128 elastically lie or abut against the side walls of the clamp/socket portion of the feedthrough 120 comprised of the two pod-like formations 122, 126 and thus:

retain the flex circuit 130 in the plugged condition into the socket comprised of the formations 122, 126 to ensure proper electrical connection of the flex circuit 130 with the conductive pathways in the feedthrough 120, thus ensuring proper electrical connection between the ESA and the OSA;

allow the flex circuit 130 to at least marginally orientate itself with respect to the feedthrough 120, thus preventing undesired damage due to shocks or vibrations while maintaining proper electrical connection of the flex circuit 130 with the conductive pathways in the feedthrough 120;

resist undesired extraction of the flex circuit 130 from the feedthrough 120;

allow easy positive extraction (e.g. by an operator) of the flex circuit 130 from the feedthrough 120 to separate the ESA from the OSA whenever either is to be removed and replaced; and facilitate prompt and reliable connection of the remaining one of the ESA or OSA with the new unit that replaces the unit that was found to be malfunctioning and replaced.

While not expressly illustrated, at least one lateral mechanical guide may be associated to the ceramic/glass clamp or socket 122, 126 in order to lock into position of the two parts (clamp or socket/flex) after connection. Similarly, by resorting to known technologies such as ceramic powder metallurgy, the clamp or socket 122, 126 can be produced in the form of a closed shape, such as an annular shape to produce an annular socket into which a flex can be inserted plug-like.

Those of skill in the art will appreciate that forming the clamp or socket 122, 126 as shown in FIG. 3 (i.e. adding the pod-like formation 126) does not entail any appreciable modification and/or added complexity to the process already used for manufacturing the standard OSA's as shown in FIG. 2. In fact, only an additional ceramic layer is arranged over the standard feedthrough 120 to produce the pod-like formation 126.

In the alternative embodiment of FIG. 4, a "flex" (i.e. a flexible PCB) 130 is again shown. In this case the flex circuit 130 has one of its ends (left side in FIG. 4) connected in any conventional way, e.g. by soldering, to the formation 122 in the feedthrough 120. The ESA board 106 carries in turn a rigid body 1200 of a ceramic or glass material as required for high data rate operation in the form of a clamp or socket including two "tines" 1220, 1260. The clamp or socket body has provided thereon electrical pathways such as the pathways included in the feedthrough 120. The clamp or socket 1220, 1260 is adapted to receive therein the other (right hand) end of the flex 130 that carries resilient elastic contacts 128 as described in the foregoing in connection with FIG. 3.

Again, once the (right hand) end of the flex 130 is plugged into the socket formed by the body 1200, the contact elements 128 carried by the flex 130 elastically lie or abut against the side walls of the clamp/socket 1220, 1260 and thus:

retain the flex 130 in the plugged condition into the socket comprised of the formations 122, 126 to ensure proper electrical connection of the leads in the flex 130 with the conductive pathways in the clamp/socket 1220, 1260 mounted on the ESA 106, thus ensuring proper electrical connection between the ESA and the OSA;

allow the pads on the flex 130 to at least marginally orientate themselves with respect to the clamp/socket 1220, 1260, thus preventing undesired damage of the flex 130 due to shocks or vibrations while maintaining proper electrical connection of the flex 130 with the conductive pathways in the clamp/socket 1220, 1260;

resist undesired extraction of the flex 130 from the clamp/socket 1220, 1260;

allow easy positive extraction (e.g. by an operator) of the flex 130 from the clamp/socket 1220, 1260 to separate the ESA from the OSA whenever either is to be removed and replaced; and facilitate prompt and reliable connection of the remaining one of the ESA or OSA with the new unit that replaces the unit that was found to be malfunctioning and replaced.

Of course, the basic principle of the disclosure remaining the same, the details and embodiments may vary, even significantly, with respect to what has been previously described by way of example only, without departing from the scope of the present disclosure as defined in the annexed claims. Specifically, it will be appreciated that terms such as "optical", "light", "photodetector", and the like are used herein with the meaning currently allotted to those terms in fibre and integrated optics, being thus intended to apply i.a. to radiation including the infrared, visible and ultraviolet ranges.

What is claimed is:

1. An electro-optical communication device comprising:
an electronic subassembly;
an optical subassembly;
a body of a rigid dielectric material mounted on one of said electronic subassembly and said optical subassembly, said body having electrically conductive pathways provided thereon and including a shaped portion providing a socket-like formation; and
at least one electrical contact element for coupling with the other of said electronic subassembly and said optical subassembly, said at least one electrical contact element being pluggable into said socket-like formation of said body of a rigid dielectric material; said at least one electrical contact element including elastic means adapted to elastically co-operate with said socket-like formation of said body of a rigid dielectric material to retain said at least one electrical contact element plugged in said socket-like formation to provide electrical contact with said electrically conductive pathways in said body of a rigid dielectric material, while permitting vibrational displacement of said at least one electrical contact element within said socket-like formation;
wherein the socket-like formation comprises upper and lower elements defining the socket-like formation, the upper and lower elements protruding from a casing wall of the optical subassembly and extending from an electrical feedthrough disposed on the casing wall.

2. The electro-optical communication device of claim 1, wherein said body of a rigid dielectric material includes a body of a material selected out of a ceramics material and glass.

3. The electro-optical communication device of claim 2, wherein said body of a rigid dielectric material includes a body of alumina.

4. The electro-optical communication device of claim 1, wherein said body of a rigid dielectric material is a feedthrough provided in the casing of said optical subassembly.

5. The electro-optical communication device of claim 1, wherein said body of a rigid dielectric material includes two pod-like extensions jointly defining said socket-like formation.

6. The electro-optical communication device of claim 1, wherein said at least one electrical contact element is provided with metallisation patterns that constitute by themselves said elastic means adapted to elastically co-operate with said socket-like formation of said body of a rigid dielectric material.

7. The electro-optical communication device of claim 6, wherein said metallisation patterns are in the form of bumps.

8. The electro-optical communication device of claim 1, wherein said at least one electrical contact element is provided with metallisation patterns having associated said elastic means adapted to elastically co-operate with said socket-like formation of said body of a rigid dielectric material.

9. The electro-optical communication device of claim 1, wherein said at least one electrical contact element is carried by a flexible element.

10. The electro-optical communication device of claim 9, wherein said flexible element is a flexible printed circuit board.

11. A method of connecting an electronic subassembly and an optical subassembly in an electro-optical communication device, the method including the steps of:
providing an electronic subassembly and an optical subassembly in an electro-optical communication device;
mounting on one of said electronic subassembly and said optical subassembly a body of a rigid dielectric material, said body having electrically conductive pathways provided thereon and including a shaped portion providing a socket-like formation;
coupling with the other of said electronic subassembly and said optical subassembly at least one electrical contact element including elastic means adapted to elastically co-operate with said socket-like formation of said body of a rigid dielectric material to retain said at least one electrical contact element plugged in said socket-like formation to provide electrical contact with said electrically conductive pathways in said body of a rigid dielectric material, while permitting vibrational displacement of said at least one electrical contact element within said socket-like formation; and plugging said at least one electrical contact element into said socket-like formation of said body of a rigid dielectric material;
wherein the mounting the body of the rigid dielectric material comprises forming upper and lower elements which define the socket-like formation, the upper and lower elements protruding from a casing wall of the optical subassembly and extending from an electrical feedthrough disposed on the casing wall.

* * * * *